(12) United States Patent
Andriessen

(10) Patent No.: US 6,602,731 B2
(45) Date of Patent: Aug. 5, 2003

(54) MANUFACTURING OF A THIN INORGANIC LIGHT EMITTING DIODE

(75) Inventor: Hieronymus Andriessen, Beerse (BE)

(73) Assignee: AGFA Gevaert, Mortsel (BE)

( * ) Notice: Subject to any disclaimer, the term of this patent is extended or adjusted under 35 U.S.C. 154(b) by 24 days.

(21) Appl. No.: 10/053,990

(22) Filed: Jan. 24, 2002

(65) Prior Publication Data

US 2003/0003614 A1 Jan. 2, 2003

Related U.S. Application Data (60) Provisional application No. 60/271,137, filed on Feb. 23, 2001.

(30) Foreign Application Priority Data

Feb. 7, 2001 (EP) .............................................. 01000006

(51) Int. Cl.$^7$ ............................................. H01L 21/00
(52) U.S. Cl. ............................................. 438/29; 257/98
(58) Field of Search ................................ 438/22, 29–32, 438/24, 7, 48, 674; 257/98, 102–103

(56) References Cited

U.S. PATENT DOCUMENTS

| | | | |
|---|---|---|---|
| 6,129,986 A | 10/2000 | Bessho et al. .............. | 428/421 |
| 6,284,988 B1 * | 9/2001 | Watanabe et al. ........... | 200/5 A |
| 6,503,831 B2 * | 1/2003 | Speakman .................. | 438/674 |

OTHER PUBLICATIONS

European Search Report, Application No. 01 00 0006, Jun. 7, 2001.
Bredol, M. et al.: "ZnS Precipitation: Morphology Control" Journal of Materials Science, GB Chapman and Hall Ltd. London, vol. 33, No. 2, Jan. 15, 1998 pp. 471–476, XP000731083,.
Chemical Abstracts, vol. 129, No. 6, Aug. 10, 1998 Columbus, OH, US; abstract No. 73962, Vacassy, R. et al: Nanostructured zinc sulfide phosphors XP002169033.
Li J. et al: "Nanosized zince sulfide obtained in the presence of cationic sufactants" Advanced Materials, DE, VCH Verlagsgesellschaft, Weinheim, vol. 10, No. 12, Sep. 20, 1998 pp. 946–949, XP000781125.
Database WPI, Section CH, Week 199950, Derwent Publications Ltd., London, GB; Class L03, AN 1999–586196, XP002168887, Abstract.

* cited by examiner

*Primary Examiner*—David Nelms
*Assistant Examiner*—David Vu
(74) *Attorney, Agent, or Firm*—Joseph T. Guy; Nexsen Pruet Jacobs & Rollard, LLC (57) ABSTRACT

Nanoparticle dispersions of ZnS doped with a luminescent center and of $Cu_xS$ are prepared together or separately by precipitation from aqueous solutions. When such dispersions are coated between conductive electrodes a Thin Film Inorganic Light Emitting Diode device is obtained.

12 Claims, 6 Drawing Sheets

FIG. 6 ic Light Emitting Diode.

MANUFACTURING OF A THIN INORGANIC LIGHT EMITTING DIODE

This application claims the benefit of provisional application No. 60/271,137, filed Feb. 23, 2001.

FIELD OF THE INVENTION

The present invention relates to the manufacturing of a Thin Film Inorganic Light Emitting Diode.

BACKGROUND OF THE INVENTION

At present several thin film electroluminescent devices (ELDs) exist or are still in development. They are all characterized by one (or more) electroluminescent active layer(s) sandwiched between two electrodes. Optionally a dielectric layer may also occur. The substrate can be plastic or glass.

The thin film ELDs can be subdivided into the organic and the inorganic based ELDs. The organic based thin film ELDs[1] are further subdivided into Organic molecular or Oligomeric Light Emitting Diodes (OLEDs) and Polymer Light Emitting Diodes (PLEDs). The inorganic ELDs on the other hand can be further subdivided into the High Voltage Alternating Current (HV-AC) ELDs and the Low Voltage Direct Current (LV-DC) ELDs. Amongst the HV-AC ELDs, one can distinguish Thin Film ElectroLuminescent Devices (TFEL devices or TFELDs) and Powder ELDs (PEL Devices or PELDs). Amongst LV-DC ELDs one can distinguish Powder ELDs (DC-PEL Devices or DC-PELDs) and thin film DC-ELDs, hereinafter called Inorganic Light Emitting Diodes (ILEDs).

The basic construction of organic ELDs (PLED and OLED) comprises following layer arrangement: a transparent substrate (glass or flexible plastic), a transparent conductor, e.g. Indium Tin Oxide (ITO), a hole transporting layer, a luminescent layer, and a second electrode, e.g. a Ca, Mg/Ag or Al/Li electrode. For OLEDs the hole transporting layer and the luminescent layer are 10–50 nm thick and applied by vacuum deposition; for PLEDs the hole transporting layer is 40 nm thick and the luminescent layer is 100 nm and applied by spin coating. Between both electrodes a direct voltage of 5–10 V is applied.

For OLEDs the hole transporting layer and electroluminescent layer consist of low molecular organic compounds, including oligomers. E.g. N,N'-diphenyl-1,1'-biphenyl-4,4'-diamine (TPD) can be used as hole transporter, and as electroluminescent compounds the aluminium (III) 8-hydroxyquinoline complex ($Alq_3$), polyaromatics (anthracene derivatives, perylene derivatives and stilbene derivatives) and polyhetero-aromatics (oxazoles, oxadiazoles, thiazoles etc.) can be used. The main advantages of these low molecular OLEDs include high fluorescent quantum yield, high purification and crystal growth capability and a wide selection of material design. Crystallisation of initially amorphous samples, production of exciplexes with other materials, and often high chemical reactivity create serious problems in their application to stable EL systems. Moreover, the layers are applied by using vacuum-vapour deposition techniques, which are often cumbersome and expensive. However, recently monochromic displays based on this principle are launched on the market by Pioneer[3].

On the other hand the electroluminescent compounds that can be used in PLEDs are polymers like the non-conjugated polyvinylcarbazole derivatives (PVK) or the conjugated polymers like poly(p-phenylene vinylenes) (PPV), poly(3-alkylothiophene, poly(p-phenylene ethynylenes) etc. These high molecular weight materials allow for the easy preparation of thin films by casting, and show a high resistance to crystallization. The difficulties in purifiation procedures (and hence reproducability) and, mostly, a low fluorescent quantum yield, in addition to a complex structure and high sensitivity towards oxygen and moisture are severe drawbacks in their application to organic ELDs.

As mentioned before, today, two kinds of HV-AC inorganic based ELDs exist[2]: PELDs and TFELDs. PEL Devices are used mainly for backlighting and low information content displays and can be manufactured on flexible substrates. TFEL devices are used for high information content matrix displays and can only be produced on glass substrates, due to the high processing temperature needed. Their basic structure is essentially the same. A PELD consists of a transparent substrate, a transparent conductor (ITO), a luminescent layer of doped ZnS (50 µm), an insulator/reflector layer (50 µm), and a top electrode, e.g. Ag-paste. Between both electrodes an alternating voltage of 110 V and 400 Hz is applied. A TFEL device consists of a transparent substrate, a transparent conductor, and a luminescent phosphor layer (0.6 µm) between two moisture protective insulator layers (0.6 µm), and a top electrode, e.g. evaporated metal. Between both electrodes an alternating voltage of 200 V and 400 Hz is applied.

For both devices, doped ZnS is used as the active luminescent layer. The doping centers (e.g., $Mn^{2+}$, $Cu^+$) can be excited by the impact of injected electrons by means of a high electric field or by transfer of recombination energy towards an electroluminescent center. These excited centers relax to the ground state by a luminescence process. Several mechanisms for the electroluminescence process have been proposed[4]. The insulating layer for the PELD (screen printed $BaTiO_3$-powder+binder) fulfils three functions: (1) it prevents catastrophic breakdowns, (2) due to the high dielectric constant, the electric field will predominantly be focussed over the ZnS layer and (3) it will serve as diffuse light reflector, which increases the light output. For the TFEL device the vacuum deposited $Al_2O_3$ prevents also catastrophic breakdowns and it functions as tunnelling barrier for the electron injection. The structures are completed by two electrodes, one of which should be transparent.

For the PEL device, the ZnS layer comprises ZnS powder doped with copper ions and possibly other elements like chlorine and manganese mixed in an organic binder with a high dielectric constant like polyvinylidene fluoride or some kind of cyanoresin. The powders are prepared by high temperature sintering processes (>700° C.) in order to allow diffusion of the dopants into the ZnS crystal matrix and integration of $Cu_xS$-rich needles in- and outside the ZnS latice after cooling. For the HV-AC PELDs, the $Cu_xS$-needles at the surface are chemically removed by etching with cyanide ions. This to ensure electrical isolating particles. After that the particles are provided with a moisture protective layer like $Al_2O_3$ or NC (carbon-nitride) in order to increase the lifetime of the phosphor. The particle size of these powders varies between 2–20 µm. The dispersion of this powders can be used in a screen printing process in order to apply them in an electroluminescent layer with a thickness of 50–100 µm.

Upon applying an electric field on the phosphor particles, charges (e.g. electrons) are generated inside the particles at stacking faults in the ZnS latice and/or in the $Cu_xS$ needles. These charges can move according to the direction of the applied field (AC). By this way recombination processes can occur whereby the recombination energy can be transferred to an electroluminescent center (e.g. $Cu^+$ or $Mn^{2+}$). Also direct impact excitation of the luminescence center can occur if the kinetic energy of the electron is high enough (ca 4–5 eV). These processes can give rise to electroluminescence.

Electroluminescence occurs normally at field strengths in the order of 1–2 MV/cm. For a layer thickness of 100 μm, applying 110 V results in a mean value of the field strength of 50 kV/cm. The $Cu_xS$ needles at the interior of the ZnS-particles increase locally the electric field strength by a factor of 50 to 100 resulting in field strength values of up to 1 MV/cm, thereby making electroluminescence possible. The thick layer causes a slow luminance-voltage response, making PEL devices unsuitable for display applications.

General drawbacks of these PELDs are price (large amounts of products needed (about 150 g phosphor per square meter), the expensive $BaTiO_3$ layer, the high driving voltages (around 110 V) and their inherent instability. The latter is caused by the slowly decrease in number of crystal stacking faults and $Cu_xS$ needles by applying an electric field (recrystallisation). The less stacking faults or $Cu_xS$ needles, the less charges (electrons) can be generated and hence a decrease in light output can be expected.

For the TFEL device, the doped ZnS layer is preferably deposited by using the Atomic Layer Epitaxy technology (Planar International), which also requires a high temperature sintering step, thereby limiting the substrates to glass substrates. The formed doped ZnS-layer is crystalline. This layer is sandwiched between two thin isolating $Al_2O_3$ layers. Upon applying a high voltage, typically between 150–200 V, tunneling of electrons occurs through these $Al_2O_3$ layers. Due to the high crystallinity of the ZnS layer, the electrons can travel freely under the influence of the applied electric field in this doped ZnS layer, thereby accumulating kinetic energy. At accumulation values of about 4–5 eV, impact excitation of the dopant can occur resulting in electroluminescence. The thin electroluminescent layer (1–1.5 μm) shows a treshhold behaviour of the luminance-voltage curve, making this TFEL device suitable for display applications.

General drawbacks of this system are the slow and expensive production process and the necessity of complete protection against ambient humidity.

Low voltage DC PEL Devices were developed by Vecht et al[5]. They used the same phosphor particles as for the AC-PELDs, but the conductive $Cu_xS$-needles at the surface are not removed. The general construction consists of a transparent substrate, a transparent conductor (ITO), a doped ZnS phosphor layer (20 μm), and a top electrode (evaporated Alu).

The phosphor layer is applied by means of the doctor blade technique or screen printing on an ITO conducting layer. Subsequently an Alu electrode is evaporated. Upon applying a direct current voltage of several volts (ITO positive), the p-conductive $Cu_xS$ starts moving towards the Alu electrode, thereby creating an insulating region (about 1 μm in thickness) next to the ITO layer within one minute or so. This results in a current drop which is associated with the onset of light emission. This process has been called the forming process. In this formed thin high resistive phosphor layer, high electric fields occur and electroluminescence is already possible at low voltages (typically between 10 and 30 V).

Major drawbacks of this system are the irreproducability of the forming process and the necessity of complete encapsulation against moisture. Also the preparation of the phosphor particles requires high sintering temperatures. No commercial devices based on this principle are on the market today.

Recently, several research groups reported photo-[7–13] and electroluminescence[14–18] from inorganic semiconducting nano particles.

Colvin et al.[14] reported on the electroluminescence of CdSe nano-particles stabilized by hexane dithiol. They demonstrated EL for two devices comprising a spincoated double layer of CdSe and PPV on ITO and covered it with an evaporated Mg electrode. Depending on the voltage they observed emission from the CdSe (lower voltages) or from the PPV (higher voltages).

Electroluminescence of CdSe quantum-dot/polymer composites was also reported by Dabbousi et al.[15]. They spincoated on ITO one single layer of CdSe nano-particles stabilized with trioctylphosphine oxide and mixed with a polymeric hole transporter (PVK) and an electron transport species (an oxadiazole derivative of PVK, t-Bu-PBD). An aluminum electrode was subsequently evaporated. The system showed electroluminescence in reverse bias, and depending on the applied voltage the emission spectrum of the CdSe quantumdots or PVK was observed.

Gao et al.[16] reported on the electroluminescence of self-assembled films of PPV and CdSe nano-particles. They could observe electroluminescence from the CdSe particles and/or from the PPV, depending on the applied voltage.

These examples demonstrate the possible use of inorganic nano-particles with semiconductor properties as Light Emitting Diodes (ILED), in analogy with the OLEDs. However, the use of Cd- or Se-compounds can not be recommended due to environmental problems that can be expected.

Huang et al.[17] reported the photo- and electroluminescence of a single layer of ZnS:Cu nanocrystals spincoated on a ITO substrate and evaporated with an aluminum electrode. ZnS and $Cu_xS$ are much more environmental friendly compared to CdSe. Also there was no need for organic hole or electron transporters, which can cause stability problems as is known in the organic PELDs. The drawback of their system lies in the fact that the synthesis of the ZnS:Cu particles is quite cumbersome and results in low yields. Polystyrene sulphonic acid is used as polyelectrolyte on which Zn and Cu ions are attached. Subsequently this polyelectrolyte is solved in dimethylformamide and reacted with $H_2S$. By this way $ZnS:C_xS$ particles are formed.

Que et al.[18] reported photo- and electroluminescence from a copper doped ZnS nanocrystals/polymer composite. The synthesis of the nano-particles was carried out by using the inverse microemulsion method. After washing and drying the ZnS:Cu powder was redispersed in MEK with PMMA as a binder and spincoated on ITO and evaporated with an aluminum electrode. Green electroluminescence could be observed in both bias directions at 5 V. The drawback of the fabrication of this device is the low concentrations of the ZnS:Cu dispersion that can be obtained (ca $10^{-3}$ M). Further it needs a well defined two phase system (soap/water). Also a drawback could be the solvent based spincoating dispersion.

References (1) Kalinowski J.; J. Phys. D: Appl. Phys. 32 (1999) R179–R250.

(2) De Visschere, 'Status of electroluminescent display technologies', Conference papers of ChemiChromics'97, 1997

(3) http://www.pioneerelectronics.com (4) A. G. Fischer, J. Electrochemical Soc., (1963), Vol. 110, Nr. 7, 733–746.

(5) S. Chadha, Powder Electroluminescence, Solid State Lumin. (1993) 159–227

(6) Eshuis A.; van Elderen G. R. A.; Koning C. A. J.; Colloids and Surfaces A: Physicochemical and Engineering Aspects (1999), 151, 505–512.

(7) Gallagher, D.; Heady, W. E.; Racz, J. M.; Bhargava, R. N.; J. Mater. Res. (1995), 10(4), 870–6

(8) Murase, N.; Jagannathan, R.; Kanematsu, Y.; Watanabe, M.; Kurita, A.; Hirata, K.; Yazawa, T.; Kushida, T.; J. Phys. Chem. B (1999), 103(5), 754–760.

(9) Vacassy, Robert; Scholz, Stefan M.; Dutta, Joydeep; Plummer, Christopher John George; Houriet, Raymond; Hofmann, Heinrich; J. Am. Ceram. Soc. (1998), 81(10), 2699–2705.

(10) Yu, I.; Isobe T.; Senna M.; J. Phys. Chem. Solids (1996), 57(4), 373–379.

(11) Xu, S. J.; Chua, S. J.; Liu, B.; Gan, L. M.; Chew, C. H.; Xu, G. Q. Appl. Phys. Lett. (1998), 73(4), 478–480.

(12) Gan, L. M.; Liu, B.; Chew, C. H.; Xu, S. J.; Chua, S. J.; Loy, G. L.; Xu, G. Q.; Langmuir (1997), 13(24), 6427–6431

(13) Leeb, J.; Gebhardt, V.; Mueller, G.; Haarer, D.; Su, D.; Giersig, M.; McMahon, G.; Spanhel, L. Institut fuer Silicatchemie, Universitaet Wuerzburg, Wuerzburg, Germany. J. Phys. Chem. B (1999), 103(37), 7839–7845.

(14) Colvin V. L., Schlamp M. C. & Alivisatos A. P., Nature (1994), Vol 370, 354–357.

(15) Dabbousi B. O., Bawendi M. G., Onitska O. and Rubner M. F., Appl. Phys. Lett. (1995) 66 (11) 1316–1318

(16) Gao M., Richter B., Kirstein S. and Möhwald H., J. Phys. Chem. B (1998), 102, 4096–4103.

(17) Huang J., Yang Y., Xue S., Yang B., Liu S., Shen J. Appl/. Phys. Lett. (1997) 70(18), 2335–2337.

(18) Que, Wenxiu; Zhou, Y.; Lam, Y. L.; Chan, Y. C.; Kam, C. H.; Liu, B.; Gan, L. M.; Chew, C. H.; Xu, G. Q.; Chua, S. J.; Xu, S. J.; Mendis, F. V. C.; Appl. Phys. Lett. (1998), 73(19), 2727–2729.

(19) Rossetti R., Hull R., Gibson J. M., Brus L. E.; J. Phys. Chem. (1985), 82, 552–559.

OBJECTS OF THE INVENTION

It is the object of the present invention to provide an easy and economical method for the manufacturing of a Thin Film Inorganic Light Emitting Diode device capable of emitting light under the influence of direct current.

SUMMARY OF THE INVENTION

The objects of the present invention can be realized by providing a method for manufacturing a Thin Film Inorganic Light Emitting Diode device, said method comprising following steps: either, (1) preparing a nanoparticle dispersion comprising together ZnS doped with a luminescent center (n-type semiconductor) and $Cu_xS$ (p-type semiconductor) by precipitation from appropriate aqueous solutions of the respective ions, or, (1') preparing a first separate nanoparticle dispersion of ZnS doped with a luminescent center (n-type semiconductor) and a second separate nanoparticle dispersion of $Cu_xS$ (p-type semiconductor), both by precipitation from appropriate aqueous solutions of the respective ions, (2) washing the dispersion prepared according to (1) or both dispersions prepared according to (1') to remove non-precipitated ions, (3) coating onto a first conductive electrode the dispersion resulting from steps (1) and (2), or a mixture of the dispersions resulting from steps (1') and (2) in one and the same layer, or the separate dispersions resulting from steps (1') and (2) in two separate layers, (4) applying on top of said coated layer(s) resulting from step (3) a second conductive electrode, with the proviso that one of said first or second electrodes is transparent.

BRIEF DESCRIPTION OF THE DRAWINGS

FIG. 1 illustrates the construction of an ILED device according to example 1.4 (see furtheron).

FIG. 1e represents a top view of the complete patterned ILED. 31 represents a direct current-voltage source (I/V source) connected to the ITO electrode and the aluminum electrode via contact points 32 and 33.

DETAILED DESCRIPTION OF THE INVENTION

The present invention will now be discussed in more detail on the hand of its preferred embodiments.

In a first preferred embodiment zinc ions, copper ions and sulfide ions are mixed together from aqueous solutions in order to prepare a Zn(Cu)S dispersion. Three solutions are prepared, the first being a solution of a $Zn^{2+}$ salt, e.g. $ZnCl_2.2H_2O$, the second being a solution of a sulfide, e.g. $Na_2S.9H_2O$, the third being a solution of a $Cu^{2+}$ salt, e.g. $CuCl_2$. Concentrations between 0.2 and 2 M are preferred. The three solutions are preferably mixed according to the double jet principle. A little amount of sodium sulfide solution is added to the copper chloride solution and then the zinc chloride solution and the sodium sulfide solution are added simultaneously under controlled conditions of time and flow rate to the copper chloride solution. To be useful the amount of copper ions can vary from about 1% to about 20% vis-à-vis the amount of the zinc ions.

The resulting nanoparticle dispersion, or predispersion as it will be called in the examples, has to be washed and concentrated. This is preferably done by a diafiltration treatment. The diafiltration is preferably performed in the presence of a compound capable of preventing agglomeration of nanoparticles. The nature of this compound is not restricted to a particular chemical class but can be chosen from various chemical types. Preferred compounds are polyphosphoric acid or a polyphosphate such as sodium polyphosphate, a hexametaphosphate such as sodium hexametaphosphate, and thioglycerol.

In a next step a surfactant may be added to the concentrated dispersion. Any of the numerous known surfactants can be used but a preferred product is a commercial saponine.

The resulting nanoparticle dispersion is a mixture of two phases, on the one hand a dispersion of zinc sulfide doped with copper ions (ZnS:Cu), and on the other hand a separate phase consisting of $Cu_xS$. The coexistence of two phases is due to the low solubility (0.04%) of copper ions in solid ZnS. The ZnS:Cu phase is a n-type semiconductor, while the $Cu_xS$ is a p-type semiconductor.

In order to prepare the dispersion for coating a binder may be added. Preferred binders are aqueous solutions of polyvinyl alcohol (PVA), polyvinyl pyrrolidone (PVP), polystyrene sulphonic acid (PSSH) and a complex of poly(3,4-ethylenedioxythiophene) and polystyrene sulphonic acid (PEDOT/PSSH). Adding of these binders improves the stability of the nanoparticle dispersions.

When a thus prepared nanoparticle dispersion is incorporated between two conductive electrodes a so-called Thin Film Inorganic Light Emitting Diode (ILED) is formed. This will now be explained in more detail.

The dispersion is coated on a patterned (see FIG. 1 in the example section) first conductive electrode. In one preferred embodiment this conductive electrode is an ITO (Indium Tin Oxide) electrode. Thin transparent electrodes of evaporated Ag, Au, . . . can also be used. The transparent electrode is preferably applied on top of a plastic substrate, e.g. a polyester substrate such as a polyethylene terephthalate substrate, but a glass substrate can also be used. In case the top-electrode (second electrode) is transparent, a non-transparent electrode on glass or plastic can also be used (e.g. Al, Ca, Ag, Mg, Au, etc.) as first electrode.

In a preferred alternative embodiment the first conductive electrode is a foil comprising a polythiophene/polyanion conductive complex. Preferably this complex is a poly(3,4-ethylenedioxythiophen)/polystyrene sulphonate complex. A foil comprising such a conductive complex is commercially available as ORGACON, (registered trade name of Agfa-Gevaert N.V.).

The dispersion to be coated can be applied on top of the first electrode by any suitable coating technique. For the manufacturing of a small prototype spincoating is mostly preferred, but for larger areas doctor blade coating or continuous coating techniques such as used in photographic emulsion coating like air knife coating or curtain coating can be used. The obtained thickness of the dispersion layer is dependent from the nature and concentration of the binder, and from the coating conditions. This thickness is preferably between 50 and 1000 nm.

Finally, a second conductive electrode is applied on top of the coated layer. At least one of the conductive electrodes must be transparent. In a preferred embodiment the second conductive electrode is an aluminum electrode (cathode) applied by vacuum deposition. Also Ca, Mg, LiF/Al, Ag can be used. In case the bottom electrode used is non-transparent (Al, Ag, . . . ) a transparent electrode should be applied on top of the spincoated $ZnS:Cu_xS$ layer. This can be done by spincoating a PEDOT/PSS dispersion, or by sputtering an ITO layer on top of it, or by evaporation of a thin and transparent conductive metallic layer like Al, Ag, Au, . . . .

When the resulting device is driven at different direct current bias voltages greenish electroluminescence at 515 nm can be observed starting from a certain turn-on voltage, usually from 4 V on. In some cases diode behaviour together with electroluminescence in both bias directions is observed, as will be shown furtheron by the examples.

In an alternative embodiment the n-type ZnS:Cu dispersion and the p-type $Cu_xS$ dispersion are not precipitated together but separately from the appropriate ion solutions. Both separate dispersions may then be mixed before the coating step, e.g. after separate diafiltration treatments, or after separate addition of a binder to the two dispersions. In still another alternative embodiment the two separately prepared dispersions are not mixed at all but are coated in two separate layers on top of each other in a double layer assemblage. In these alternative embodiments also green luminescence could be generated.

In a further preferred embodiment according to the present invention a dispersion containing a mixture of zinc sulfide doped with manganese (and possibly copper ions, depending on the precipitation conditions), and of a $Cu_xS$ phase are prepared. Again the precipitation is preferably performed according to the double jet principle. For instance, a little amount of a sodium sulfide solution is added to a copper(II) chloride solution. Then a solution containing both zinc chloride and manganese acetate, and the sodium sulfide solution are added simultaneously under controlled conditions to the copper(II) chloride solution. A mixture of Zn:Mn,Cu and $Cu_xS$ dispersions is obtained. The further preparation steps of the dispersion and the incorporation into an Inorganic Light Emitting Diode proceed similarly to the first embodiment. Again, according to alternative embodiments, a separate ZnS:Mn,Cu or ZnS:Mn dispersion, and a separate $Cu_xS$ dispersion can be prepared. The dispersions can be mixed before coating or they can be coated in separate layers according to a double layer assemblage. In all these embodiments wherein manganese is incorporated orange-yellow electroluminescence can be generated when applying the appropriate turn-on voltage.

It should be clear that ZnS can be doped with any ion that creates a luminescent center as there are Ag, Eu, Tb, Au, etc.

The present invention will now be illustrated by the following examples without however being limited thereto.

EXAMPLES

1. Green Emitting Single Layer ILEDs 1.1. Preparation of the Zn(Cu(1%))S—Dispersion:

The following solutions were prepared:

| Solution 1 | |
| --- | --- |
| $ZnCl_2.2H_2O$ | 81.76 g |
| Water | to 600 ml |
| Solution 2 | |
| $Na_2S.9H_2O$ | 141.6 g |
| NaOH (50%) | 3.6 ml |
| Water | to 600 ml |
| Solution 3 | |
| $CuCl_2$ | 0.85 g |
| Water | to 800 ml |

The ZnS:Cu dispersion was prepared as follows:

To solution 3, stirred at 1500 rpm at room temperature, was firstly added 0.5 ml of solution 2. Subsequently, solutions 1 and 2, both held at room temperature, were added simultaneously at a flow rate of 500 ml/min to solution 3. This is the predispersion A comprising ZnS:Cu—particles.

1.2. Washing of the Zn(Cu)S—Dispersion:

To 1000 ml of predispersion A, 1000 ml of a 2% Na-polyphosphate solution in water was added and this dispersion was diafiltrated through a Fresenius F60 cartridge. The dispersion was concentrated to 1000 ml and washed at this level by using 6000 ml of a 2% solution of Na-polyphosphate in water.

After the washing, this dispersion was concentrated by means of the diafiltration set-up to a concentration of about 35 g ZnS/l. Subsequently, 1 ml of a 12.5% solution of Saponine Quillaya (Schmittmann) in water/ethanol (80/20) solution per 20 ml dispersion was added. This is dispersion A.

The dispersion was analysed for its particle size distribution (weight average $d_{wa}$) with the Disc Centrifuge Photosedimentometer Brookhaven BI-DCP. A weight average particle size diameter of about 105 nm was obtained.

Although particle sizes could be measured with DCP, no clear particles could be visualized by Electron Microscopy (SEM, TEM). The measured particle sizes are probably due (as revealed by EM images) to aggregates of nano-sized particles[6]. This is further confirmed by the fact that ultrasonic treatment before the DCP measurement clearly influences the obtained particle size distribution. The longer the time between the ultrasonic treatment and the DCP-measurement, the larger the obtained values for the weight average particle size. Also the polydispersity increases.

XRD-measurements indicate low crystalline ZnS, however the obtained diffraction signal was used in the Debye-Scherrer equation to calculate the crystalline particle size. Depending on the precipitation conditions, particle sizes between 1.5 and 5 nm were found.

Another indication that the primary particles are indeed much smaller as revealed by DCP-measurements, is the fact that the absorption edge of the ZnS—dispersion and/or layer shifts to shorter wavelengths if compared with bulk ZnS (~330 nm). This is a well known phenomenon in quantum dots[7]. Depending on the precipitation conditions, values of the absorption edge for the ZnS dispersions or layers between 275 and 310 nm were found, indicating, according to the Brus equation[19], particle sizes between 1.5 and 5 nm.

Although that the DCP technique does not give information about particles smaller then 10–20 nm in case of real nano-particle dispersions the technique gives important information about the largest aggregates present in the dispersion. By applying layer thicknesses by means of spincoating of about 200–400 nm, it is important that the weight average particle size diameter as found by DCP after ultrasound treatment, which is also used before spincoating, stays below 150 nm and more prefarably below 100 nm in order to obtain smooth layers.

1.3. Making of the Coating Dispersions:

To dispersion A, a binder was added according to table I, in order to stabilize further the dispersion and allow for an homogeneous coating.

TABLE I

| Coating dispersion | Dispersion A | Binder | Theoretical volume ratio ZnS/Polymer in the layer |
| --- | --- | --- | --- |
| A1 | 7.4 ml | 12.6 ml of a 5.8% polystyrene sulfonic acid in water | 10/90 |
| A2 | 16.8 ml | 3.2 ml of a 5.8% polystyrene sulfonic acid in water | 50/50 |
| A3 | 19.1 ml | 0.9 ml of a 5.8% polystyrene sulfonic acid in water | 80/20 |
| A4 | 6.7 ml | 13.3 ml of a 5% polyvinylalcohol (POLYVIOL W40; Wacker Chemie) in water | 10/90 |
| A5 | 16.4 ml | 3.6 ml of a 5% polyvinylalcohol (POLYVIOL W40; Wacker Chemie) in water | 50/50 |
| A6 | 18.96 ml | 1.04 ml ml of a 5% polyvinylalcohol (POLYVIOL W40; Wacker Chemie) in water | 80/20 |
| A7 | 16.4 ml | 3.6 ml of a 5% Polyvinylpyrrolidone (LUVISKOL K-90; BASF) | 50/50 |
| A8 | 18.96 ml | 1.04 ml of a 5% Polyvinylpyrrolidone (LUVISKOL K-90; BASF) | 80/20 |

1.4. Preparation of the Thin Film Inorganic Light Emitting Diodes on ITO:

The device construction is depicted in FIG. 1. FIG. 1a shows the layer assemblage. ITO (21) on a PET substrate (20) (6 cm×6 cm×175 μm) with a surface conductivity of about 80 Ohm/Sq was patterned by using $HNO_3$. Two borders of about 1.5 cm were treated with $HNO_3$ in order to distroy the conductivity. The resulting material comprises a conductive area in the middle of the material with dimensions 6 cm×3 cm. Subsequently the coating dispersions were spincoated on this substrate. The dry layer (22) thickness varied between 150 and 400 nm depending on the binder and the rotation frequency of the spincoater. A 300 nm thick aluminum electrode (23) (cathode) was vacuum deposited on the spincoated ZnS:Cu/binder layer at $10^{-6}$ Torr through a mask. The emission area was 25 $mm^2$. FIGS. 1b, 1c and 1d separately show the patterning of the different layers, and FIG. 1e shows a top view of the complete patterned ILED.

Figure 1A:
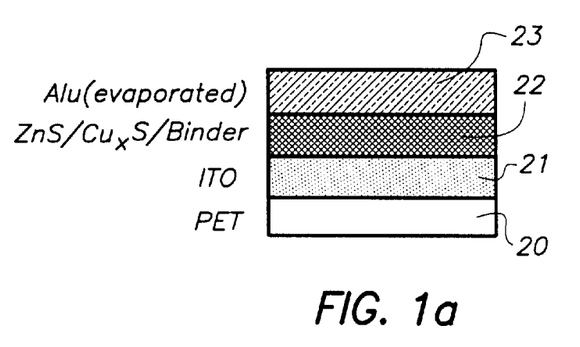
FIG. 1a represents the layer arrangement. It comprises a PET substrate 20, a first conductive ITO layer 21, a luminescent layer 22, and a second electrode layer of evaporated aluminum 23.
Figure 1B:
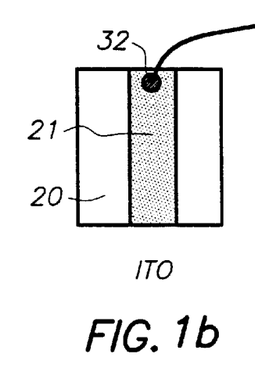
FIGS. 1b, 1c and 1d separately represent the patterning of layers 21, 22, and 23 respectively.
Figure 1C:
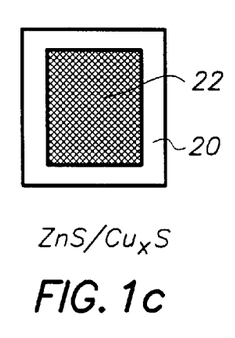
Figure 1D:
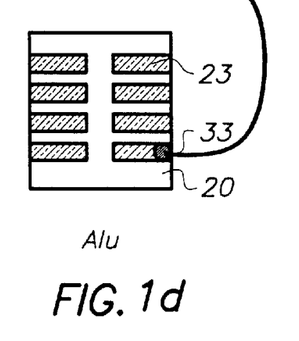
Figure 1E:
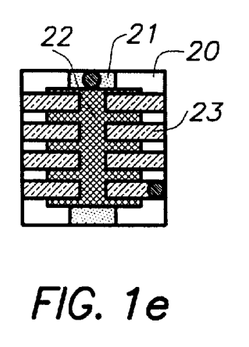
Figure 2:
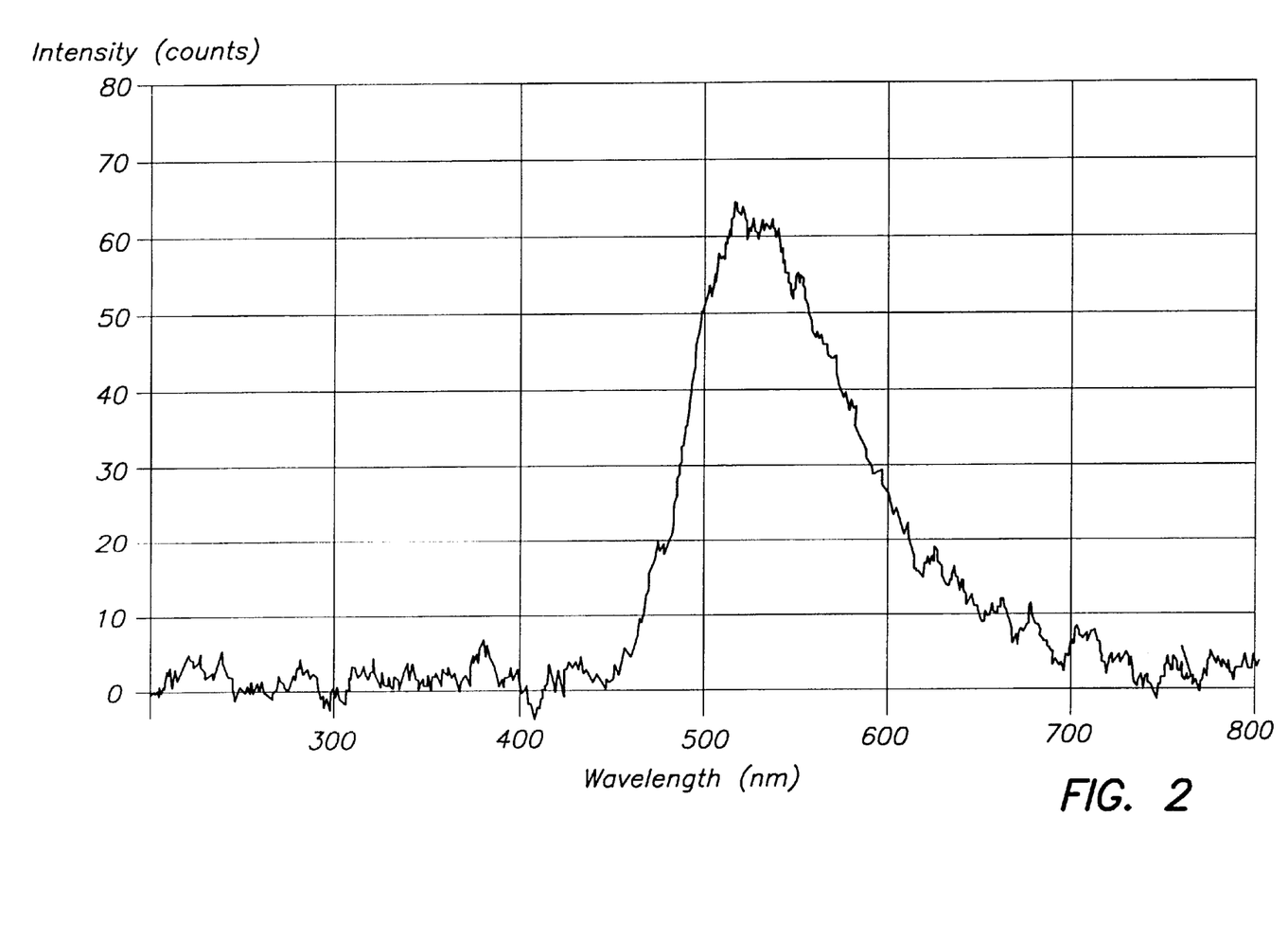
FIG. 2 represents the electroluminescence spectrum at 6 Volt obtained with an ILED constructed with sample A3 of example 1.
Figure 3:
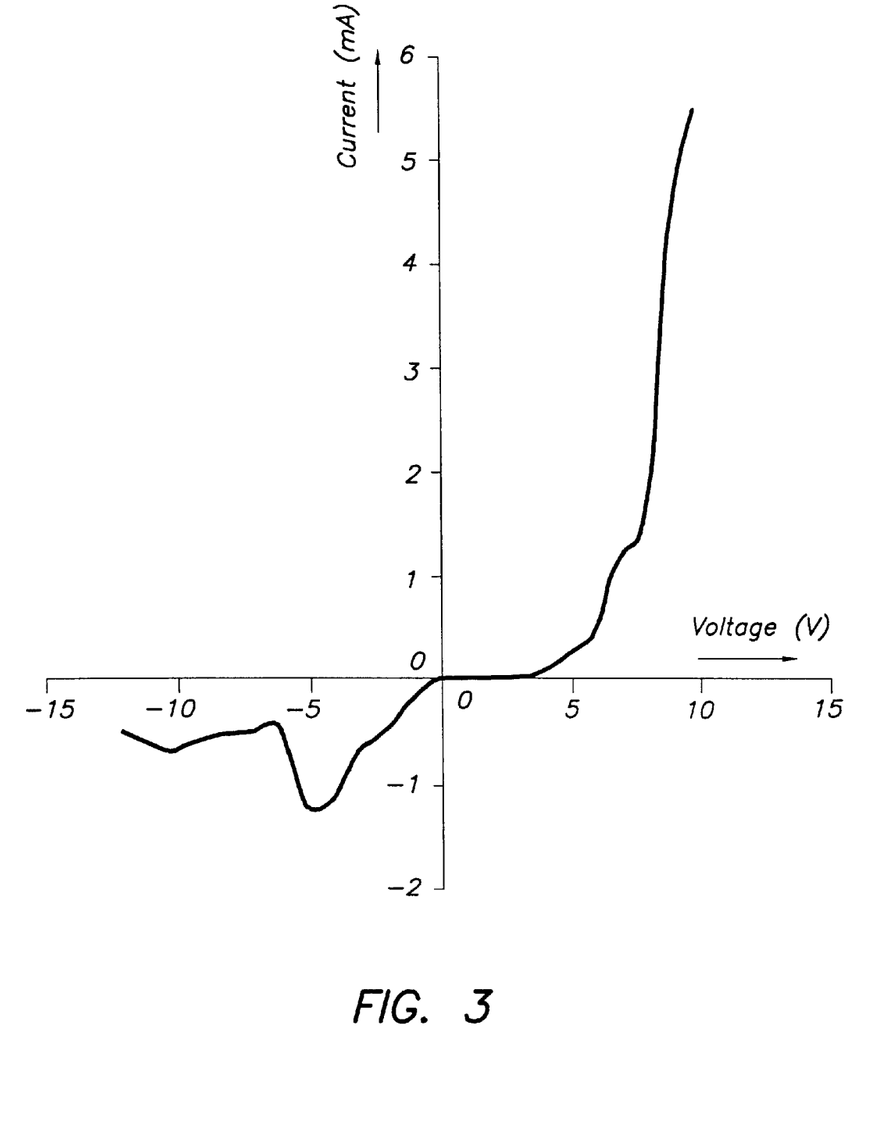
FIG. 3 represents the direct current-voltage curve (I/V curve) obtained with an ILED constructed with sample A3 of example 1.
Figure 4:
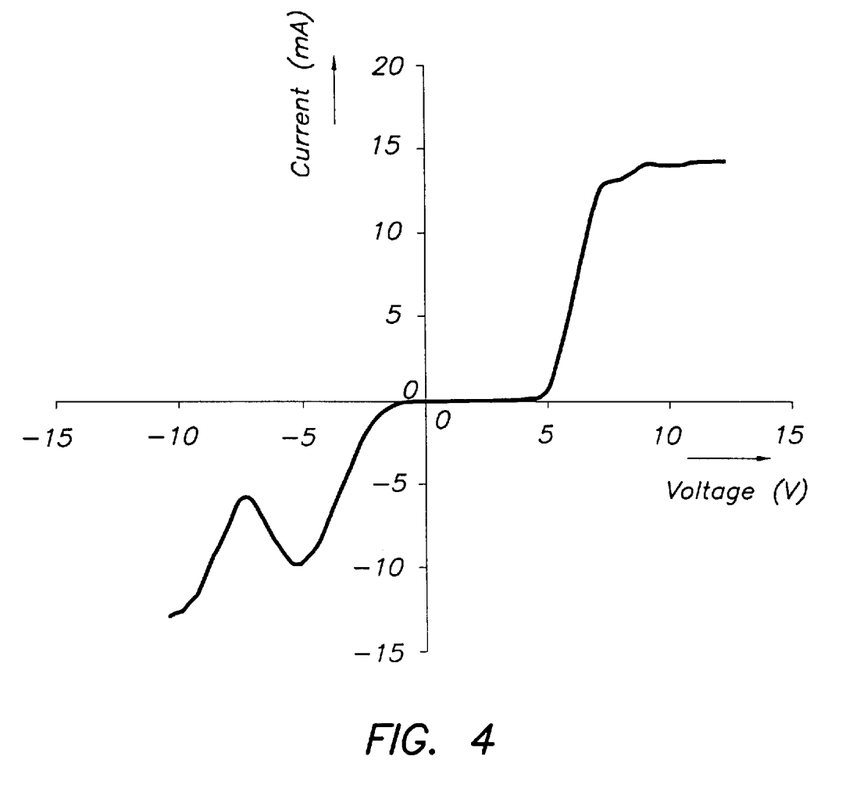
FIG. 4 represents the I/V curve obtained with an ILED constructed with sample A5 of example 1.

The device was driven at different direct current bias voltages. Table II lists the turn-on voltages at which green electroluminescence at 515 nm was observed. An example of an electroluminescence spectrum is shown in FIG. 2. The electroluminescence started as soon as currents of 5–15 mA were attained. This currents correspond to an exponential offset of the I/V-curve (diode behaviour), as is examplified in FIGS. 3 and 4. In some cases diode behaviour together with electroluminescence in both bias directions was observed. Life times are listed more quantitatively: A means EL light was only observed for less then 5 seconds, B means it was observed between 5 seconds and 3 minutes and C means that the electroluminecence could be observed for longer then 3 minutes.

TABLE II

ILEDs on ITO

| Sample | Bias | Turn-on Voltage | EL Brightness | Life Time | Bias | Turn-on Voltage | EL brightness | Life Time |
| --- | --- | --- | --- | --- | --- | --- | --- | --- |
| A1 | + | 15 V | ++ | B | − | / | / | / |
| A2 | + | / | / | / | − | / | / | / |
| A3 | + | 6 V | +++ | C | − | / | / | / |
| A4 | + | / | / | / | − | / | / | / |
| A5 | + | 10 V | ++ | C | − | 4 | + | B |
| A6 | + | 10 V | + | B | − | / | / | / |

1.5. Preparation of the Thin Film Inorganic Light Emitting Diodes on Orgacon™:

Instead of ITO, the transparent conductive film Orgacon (coated poly(3,4-ethylenedioxythiophene)/polystyrene sulphonic acid complex on a PET substrate), trade mark of Agfa-Gevaert, was used for the device construction. The device construction is similar as depicted in FIG. 1, with Orgacon™ in stead of ITO.

An Orgacon foil was cut into 6 cm×6 cm samples. Subsequently, the resist AZ7217 (Clariant) was spincoated on the samples and baked for 30 minutes at 90° C. The dry layer thickness was about 2–3 $\mu$m. This treatment was followed by an UV-exposure through a mask (ca 1 minute at 4 mW/cm$^2$), in order to illuminate the middle part (6 cm×3 cm) of the resist, according to the ITO pattern of FIG. 1. The sample was then given a prebake for 45 seconds at 110° C. and followed by a development step for 40 seconds in the AZ351B developer (Clariant). In order to obtain good adhesion a pre-exposure bake for 30 minutes at 110° C. was given. Subsequently, the non-protected areas at the two borders were desactivated by dipping the sample in a 1% NaClO solution for 20 seconds. This step was followed by rinsing with water and drying. Then, a full plane exposure for 1 minute at 4 mW/cm$^2$ was given and the resist was removed by developing in isopropanol for 90 seconds. Subsequently, the samples were washed with water and dried. The resulting material comprises a conductive area (ca 1500 Ohm/Sq) in the middle of the material with dimensions 6 cm×3 cm, similar as is depicted in FIG. 1 for the ITO samples.

Subsequently the coating dispersions were spincoated on this substrate. The dry layer thickness varied between 150 and 400 nm depending on the binder and the rotation frequency of the spincoater. A 300 nm thick aluminum electrode (cathode) was vacuum deposited on the spincoated ZnS:Cu/binder layer at 10$^{-6}$ Torr through a mask. The emission area was 25 mm$^2$.

The device was driven at different direct current bias voltages. Table III lists the turn-on voltages at which green electroluminescence at 515 nm was observed. The electroluminescence started as soon as currents of 5–15 mA were attained. This currents correspond to an exponential offset of the I/V-curve (diode behaviour). Life times are listed more quantitatively: A means EL light was only observed for less then 5 seconds, B means it was observed between 5 seconds and 3 minutes and C means that the electroluminecence could be observed for longer then 3 minutes.

TABLE III

ILEDs on Orgacon

| Sample | Bias | Turn-on Voltage | EL Brightness | Life Time | Bias | Turn-on Voltage | EL Brightness | Life Time |
|---|---|---|---|---|---|---|---|---|
| A2 (Org.) | + | 6 V | ++ | B | − | / | / | / |
| A3 (Org.) | + | 7 V | + | A | − | / | / | / |
| A7 (Org.) | + | 4 V | +++ | C | − | / | / | / |
| A8 (Org.) | + | 4 V | ++ | B | − | / | / | / |

2. Green Emitting Single Layer ILEDs 2.1. Preparation of the Zn(Cu(10%))S—Dispersion:

The following solutions were prepared:

| Solution 4 | |
|---|---|
| Na$_2$S.9H$_2$O | 154.2 g |
| NaOH (50%) | 3.6 ml |
| Water | to 600 ml |

-continued

| Solution 5 | |
|---|---|
| CuCl$_2$ | 8.53 g |
| Water | to 800 ml |

The ZnS:Cu dispersion was prepared as follows

To solution 5, stirred at 1500 rpm at room temperature, was firstly added 4.5 ml of solution 4. Subsequently, solutions 1 and 4, both held at room temperature, were added simultaneously at a flow rate of 500 ml/min to solution 5. This is the predispersion B comprising ZnS:Cu—particles.

2.2. Washing of the Zn(Cu)S—Dispersion:

To 1000 ml of predispersion B, 1000 ml of a 2% Na-polyphosphate solution in water was added and this dispersion was diafiltrated through a Fresenius F60 cartridge. The dispersion was concentrated to 1000 ml and washed at this level by using 6000 ml of a 2% solution of Na-polyphosphate in water.

After the washing, this dispersion was concentrated by means of the diafiltration set-up to a concentration of about 35 g ZnS/l. Subsequently, 1 ml of a 12.5% solution of Saponine Quillaya (Schmittmann) in water/ethanol (80/20) solution per 20 ml dispersion was added. This is dispersion B.

The dispersion was analysed for its particle size distribution (weight average $d_{wa}$) with the Disc Centrifuge Photosedimentometer Brookhaven BI-DCP. A weight average particle size diameter of about 112 nm was obtained.

2.3. Making of the Coating Dispersions:

To dispersion B, a binder was added according to table IV, in order to stabilize further the dispersion and allow for an homogeneous coating.

TABLE IV

| Coating dispersion | Dispersion B | Binder | Theoretical volume ratio ZnS/Polymer in the layer |
|---|---|---|---|
| B1 | 18.96 ml | 1.04 ml ml of a 5% polyvinylalcohol (POLYVIOL W40; Wacker Chemie) in water | 80/20 |
| B2 | 18.96 ml | 1.04 ml of a 5% Polyvinylpyrrolidone (LUVISKOL K-90; BASF) | 80/20 |

2.4. Preparation of the Thin Film Inorganic Light Emitting Diodes:

ITO on a PET substrate (175 $\mu$m) with a surface conductivity of about 80 Ohm/Sq was patterned as described in example 1. Subsequently the coating dispersions were spincoated on this substrate. The dry layer thickness varied between 150 and 400 nm depending on the binder and the rotation frequency of the spincoater. A 300 nm thick aluminum electrode (cathode) was vacuum deposited on the spincoated ZnS:Cu/binder layer at 10$^{-6}$ Torr through a mask. The emission area was 25 mm$^2$.

The device was driven at different direct current bias voltages. Table V lists the turn-on voltages at which green electroluminescence at 515 nm was observed.

TABLE V

| Sample | Bias | Turn-on Voltage | EL Brightness | Life Time | Bias | Turn-on Voltage | EL brightness | Life time |
|---|---|---|---|---|---|---|---|---|
| B1 | + | 8 V | + | B | − | / | / | / |
| B2 | + | 7 V | + | A | − | / | / | / |

3. Green Emitting Single Layer ILEDs
3.1. Preparation of the Zn(Cu(20%))S—Dispersion:
The following solutions were prepared:

| Solution 6 | |
|---|---|
| $Na_2S.9H_2O$ | 210.3 g |
| NaOH (50%) | 4.6 ml |
| Water | to 600 ml |
| Solution 7 | |
| $CuCl_2$ | 17.05 g |
| Water | to 800 ml |

The ZnS:Cu dispersion was prepared as follows:

To solution 7, stirred at 1500 rpm at room temperature, was firstly added 0.66 ml of solution 6. Subsequently, solutions 1 and 6, both held at room temperature, were added simultaneously at a flow rate of 500 ml/min to solution 7. This is the predispersion C comprising ZnS:Cu—particles.

3.2. Washing of the Zn(Cu)S—Dispersion:
To 1000 ml of predispersion C, 1000 ml of a 2% Na-polyphosphate solution in water was added and this dispersion was diafiltrated through a Fresenius F60 cartridge. The dispersion was concentrated to 1000 ml and washed at this level by using 6000 ml of a 2% solution of Na-polyphosphate in water.

After the washing, this dispersion was concentrated by means of the diafiltration set-up to a concentration of about 35 g ZnS/l. Subsequently, 1 ml of a 12.5% solution of Saponine Quillaya (Schmittmann) in water/ethanol (80/20) solution per 20 ml dispersion was added. This is dispersion C.

The dispersion was analysed for its particle size distribution (weight average $d_{wa}$) with the Disc Centrifuge Photosedimentometer Brookhaven BI-DCP. A weight average particle size diameter of about 138 nm was obtained.

3.3. Making of the Coating Dispersions:
To 18.96 ml of dispersion C, 1.04 ml ml of a 5% polyvinylalcohol (POLYVIOL W40; Wacker Chemie) in water was added in order to stabilize further the dispersion and allow for an homogeneous coating.

3.4. Preparation of the Thin Film Inorganic Light Emitting Diodes:
ITO on a PET substrate (175 μm) with a surface conductivity of about 80 Ohm/Sq was patterned. Subsequently the coating dispersion was spincoated on this substrate. The dry layer thickness varied between 150 and 400 nm depending on the binder and the frequency of the spincoater. A 300 nm thick aluminum electrode (cathode) was vacuum deposited on the spincoated ZnS:Cu/binder layer at $10^{-6}$ Torr by a mask. The emission area was 25 $mm^2$.

The device was driven at different direct current bias voltages. Table VI lists the turn-on voltages at which green electroluminescence at 515 nm was observed.

TABLE VI

| Sample | Bias | Turn-on Voltage | EL Brightness | Life Time | Bias | Turn-on Voltage | EL brightness | Life time |
|---|---|---|---|---|---|---|---|---|
| C | + | 4 V | + | C | − | / | / | / |

4. Orange-Yellow Single Layer ILED
4.1. Preparation of ZnS:Mn,Cu Dispersion:
The following solutions were prepared:

| Solution 8 | |
|---|---|
| $ZnCl_2.2H_2O$ | 81.76 g |
| $Mn(Acetate)_2.4H_2O$ | 4.85 g |
| Water | to 600 ml |
| Solution 9 | |
| $Na_2S.9H_2O$ | 154.2 g |
| NaOH (50%) | 3.9 ml |
| Water | to 600 ml |
| Solution 10 | |
| $CuCl_2$ | 8.53 g |
| Water | to 800 ml |

The ZnS:Mn,Cu predispersion was prepared as follows:

To solution 10, stirred at 1500 rpm at room temperature, was firstly added 0.5 ml of solution 9. Subsequently, solutions 8 and 9, both held at room temperature, were added simultaneously at a flow rate of 500 ml/min to solution 10. This is the predispersion D comprising ZnS:Mn,Cu—particles.

4.2. Washing of the ZnS:Mn,Cu—Dispersion:
To 1000 ml of predispersion D, 1000 ml of a 2% Na-polyphosphate solution in water was added and this dispersion was diafiltrated through a Fresenius F60 cartridge. The dispersion was concentrated to 1000 ml and washed at this level by using 6000 ml of a 2% solution of Na-polyphosphate in water.

After the washing, this dispersion was concentrated by means of the diafiltration set-up to a concentration of about 35 g Zn(Mn,Cu)S/l. Subsequently, 1 ml of a 12.5% solution of Saponine Quillaya (Schmittmann) in water/ethanol (80/20) solution of per 20 ml dispersion was added. This is dispersion D.

The dispersion was analysed for its particle size distribution (weight average $d_{wa}$) with the Disc Centrifuge Photosedimentometer Brookhaven BI-DCP. A weight average particle size diameter of about 100 nm was obtained.

4.3. Making of the Coating Dispersions:
To dispersion D, a binder was added according to table VII, in order to stabilize further the dispersion and allow for a homogeneous coating.

TABLE VII

| Coating dispersion | Dispersion D | Binder | Theoretical volume ratio ZnS/Polymer in the layer |
|---|---|---|---|
| D1 | 6.7 ml | 13.3 ml of a 5% polyvinylalcohol (POLYVIOL W40; Wacker Chemie) in water | 10/90 |

TABLE VII-continued

| Coating dispersion | Dispersion D | Binder | Theoretical volume ratio ZnS/Polymer in the layer |
|---|---|---|---|
| D2 | 16.4 ml | 3.6 ml of a 5% polyvinylalcohol (POLYVIOL W40; Wacker Chemie) in water | 50/50 |
| D3 | 18.96 ml | 1.04 ml of a 5% polyvinylalcohol (POLYVIOL W40; Wacker Chemie) in water | 80/20 |
| D4 | 6.7 ml | 13.3 ml of a 5% Polyvinylpyrrolidon (LUVISKOL K-90; BASF) | 10/90 |
| D5 | 16.4 ml | 3.6 ml of a 5% Polyvinylpyrrolidone (LUVISKOL K-90; BASF) | 50/50 |
| D6 | 18.96 ml | 1.04 ml of a 5% Polyvinylpyrrolidone (LUVISKOL K-90; BASF) | 80/20 |

4.4. Preparation of the Thin Film Light Emitting Diodes on ITO:

ITO on a PET substrate (175 μm) with a surface conductivity of about 80 Ohm/Sq was patterned. Subsequently the coating dispersions were spincoated on this substrate. The dry layer thickness varied between 150 and 400 nm depending on the binder and the rotation frequency of the spin coater. A 300 nm thick aluminum electrode (cathode) was vacuum deposited on the spincoated ZnS:Mn,Cu/binder layer at $10^{-6}$ Torr by a mask. The emission area was 25 mm².

Figure 5:
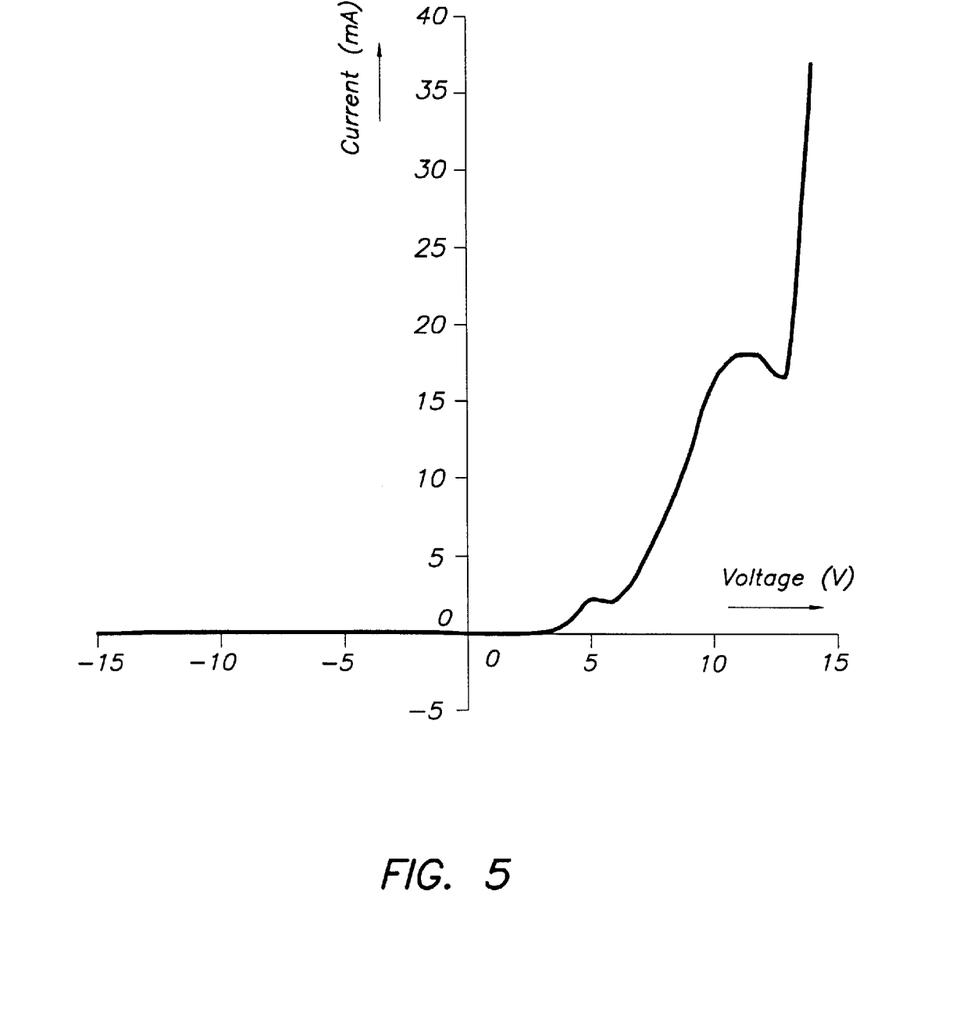
FIG. 5 repesents the I/V curve obtained with an ILED constructed with sample D5 of example 4.

The device was driven at different direct current bias voltages. Table VIII lists the turn-on voltages at which orange-yellow electroluminescence at 590 nm was observed. FIG. 5 represents the I/V curve of sample D5.

TABLE VIII

ILEDs on ITO

| Sample | Bias | Turn-on Voltage | EL Brightness | Life Time | Bias | Turn-on Voltage | EL brightness | Life time |
|---|---|---|---|---|---|---|---|---|
| D1 | + | 5 V | + | B | − | / | / | / |
| D2 | + | 5 V | + | B | − | / | / | / |
| D3 | + | 5 V | +++ | B | − | / | / | / |
| D4 | + | 8 V | + | B | − | / | / | / |
| D5 | + | 11 V | +++ | C | − | / | / | / |
| D6 | + | 4 V | +++ | B | − | 4 V | / | / |

4.5. Preparation of the Thin Film Light Emitting Diodes on Orgacon™.:

orgacon™ samples with a surface conductivity of about 80 Ohm/Sq were patterned as described in example 1. Subsequently the coating dispersions were spincoated on this substrate. The dry layer thickness varied between 150 and 400 nm depending on the binder and the rotation frequency of the spin coater. A 300 nm thick aluminum electrode (cathode) was vacuum deposited on the spincoated ZnS:Mn,Cu/binder layer at $10^{-6}$ Torr by a mask. The emission area was 25 mm².

The device was driven at different direct current bias voltages. Table IX lists the turn-on voltages at which orange-yellow electroluminescence at 590 nm was observed.

TABLE IX

ILEDs on Orgacon ™

| Sample | Bias | Turn-on Voltage | EL Brightness | Life Time | Bias | Turn-on Voltage | EL brightness | Life time |
|---|---|---|---|---|---|---|---|---|
| D1 (Org.) | + | 4 V | ++ | C | − | / | / | / |
| D2 (Org.) | + | 4 V | ++ | C | − | / | / | / |
| D3 (Org.) | + | 4 V | +++ | C | − | / | / | / |
| D4 (Org.) | + | 4 V | +++ | B | − | / | / | / |
| D5 (Org.) | + | 6 V | +++ | C | − | / | / | / |
| D6 (Org.) | + | 4 V | +++ | C | − | / | / | / |

5. Orange-Yellow and Green Emitting Double Layer ILED 5.1. Preparation of the $Cu_xS$— and ZnS—, ZnS:Mn and ZnS:Cu dispersions:

The following solutions were prepared:

| | |
|---|---|
| Solution 11 | |
| Water | 600 ml |
| Solution 12 | |
| CuCl₂.2H₂O | 37.5 g |
| Water | to 600 ml |
| Solution 13 | |
| Thioglycerol | 50 ml |
| Water | to 800 ml |
| Solution 14 | |
| Zn(acetate)₂.2H₂O | 150.4 g |
| Mn(acetate)₂.4H₂O | 4.85 g |
| Water | to 600 ml |
| Solution 15 | |
| 5-methyl-1,2,4-triazolo-(1,5-a)-pyrimidine-7-ol | 60 g |
| Water | to 800 ml |
| Solution 16 | |
| Zn(acetate)₂.2H₂O | 131.7 g |
| Na₄EDTA | 12 g |
| Cu(acetate)₂.4H₂O | 54 mg |
| Water | to 600 ml |
| Solution 17 | |
| Na₂S.9H₂O | 113.6 g |
| NH₃ (26%) | 5 ml |
| Water | to 600 ml |
| Solution 18 | |
| 5-methyl-1,2,4-triazolo-(1,5-a)-pyrimidine-7-ol | 40 g |
| NaCl | 58.44 g |
| Water | to 600 ml |

The ZnS—dispersion was prepared as follows:

To solution 11, stirred at 1500 rpm at room temperature solutions 1 and 2, both held at room temperature, were added simultaneously at a flow rate of 500 ml/min. This is the predispersion E comprising ZnS—particles.

The $Cu_xS$—dispersion was prepared as follows:

To solution 13, stirred at 1500 rpm at room temperature solutions 2 and 12, both held at room temperature, were added simultaneously at a flow rate of 500 ml/min. This is the predispersion F comprising $Cu_xS$—particles.

The ZnS:Mn-dispersion was prepared as follows:

To solution 15, stirred at 1500 rpm at 80° C. solution 2 and 14, both held at room temperature, were added simultaneously at a flow rate of 500 ml/min. This is the predispersion G comprising ZnS:Mn—particles.

The ZnS:Cu(0.05%) dispersion was prepared as follows:

To solution 18, stirred at 1500 rpm at room temperature solutions 16 and 17, both held at room temperature, were added simultaneously at a flow rate of 500 ml/min. This is the predispersion H comprising ZnS:Cu—particles.

5.2. Washing of the ZnS—, $Cu_xS$—, ZnS:Mn and ZnS:Cu—Dispersions:

To 1000 ml of predispersions E, G and H, 1000 ml of a 2% polyphosphoric acid solution in water was added and this dispersion was diafiltrated through a Fresenius F60 cartridge. The dispersion was concentrated to 1000 ml and washed at this level by using 5000 ml of a 2% solution of polyphosphoric acid in water.

After the washing, this dispersion was concentrated by means of the diafiltration set-up to a concentration of about 40 g ZnS/l. Subsequently, 1 ml of a 12.5% solution of Saponine Quillaya (Schmittmann) in water/ethanol (80/20) solution of per 20 ml dispersion was added. These are dispersions E, G and H.

To 1000 ml of predispersion F, 1000 ml of a 5% thioglycerol solution in water was added and this dispersion was diafiltrated through a Fresenius F60 cartridge. The dispersion was concentrated to 1000 ml and washed at this level by using 5000 ml of a 5% solution of thioglycerol in water.

After the washing, this dispersion was concentrated by means of the diafiltration set-up to a concentration of about 40 g $Cu_xS$/l. Subsequently, 1 ml of a 12.5% solution of Saponine Quillaya (Schmittmann) in water/ethanol (80/20) solution of per 20 ml dispersion was added. This is dispersion F.

The dispersions were analysed for their particle size distribution with the Disc Centrifuge Photosedimentometer Brookhaven BI-DCP. A weight average particle size diameter of less ten 100 nm was found for all the dispersions.

5.3. Preparation of the Thin Film Inorganic Light Emitting Diodes:

ITO on a PET substrate (175 μm) with a surface conductivity of about 80 Ohm/Sq was patterned. Subsequently dispersion F was spincoated on this substrate twice at 1000 rpm. Three samples were prepared. Subsequently on these samples, dispersions E, H and G were spincoated on top twice also at 1000 rpm. All dispersions were applied without the addition of a binder. A 300 nm thick aluminum electrode (cathode) was vacuum deposited on the spincoated double layers at $10^{-6}$ Torr through a mask. The emission area was 25 $mm^2$.

Figure 6:
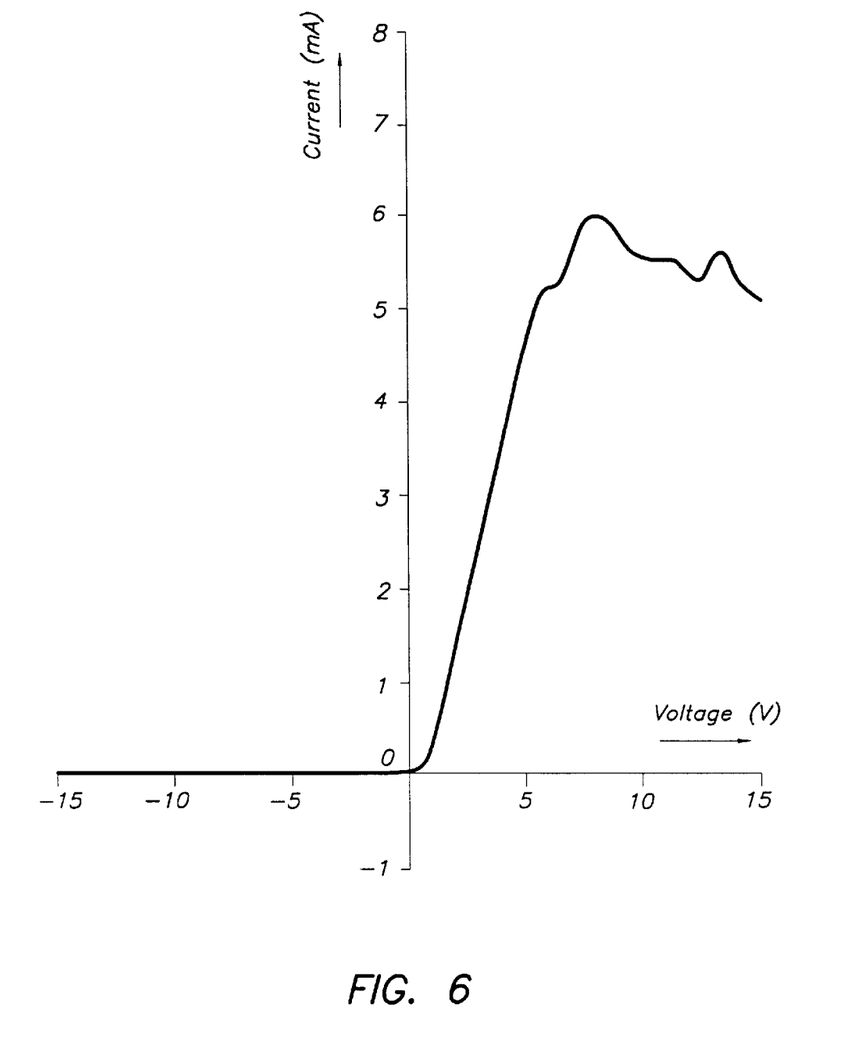
FIG. 6 represents the I/V curve obtained with an ILED constructed with sample E3 of example 5.

Table X lists the results of these double layer diodes. FIG. 6 represents the I/V curve of sample E3. Although sample E1 ($Cu_xS$+ZnS) showed a nice diode behaviour, no electroluminescence could be observed.

TABLE X

| Sample | Layer 1 | Layer 2 | Bias | Turn-on Voltage | EL Brightness | Emission λ | Life Time |
|---|---|---|---|---|---|---|---|
| E1 (contr.) | Disp F ($Cu_xS$) | Disp E (ZnS) | + | – | – | – | – |
| E2 (inv.) | Disp F ($Cu_xS$) | Disp G (ZnS:Mn) | + | 10 V | + | 590 nm | B |
| E3 (inv.) | Disp F ($Cu_xS$) | Disp H (ZnS:Cu) | + | 11 v | + | 515 nm | B |

6. Orange-Yellow and Green Emitting Single Layer ILEDs

To 16.4 ml of dispersions E, F, G and H, respectively 3.6 ml of a 5% polyvinylpyrrolidone (LUVISKOL K-90; BASF) was added. These are dispersions E', F', G' and H'

Dispersion F' was subsequently mixed according to table XI with dispersions E', G' and H' and the devices were made according to the description of example 1 (1.4).

TABLE XI

| Sample | Dispersion X' | Ratio of F'/X' | EL brightness at forward bias | Turn-on Voltage |
|---|---|---|---|---|
| F1 (contr.) | E' | 50/50 | — | — |
| F2 (inv.) | H' | 50/50 | ++ (515 nm) | 9 V |
| F4 (inv.) | G' | 10/90 | + (590 nm) | 5 V |
| F5 (inv.) | G' | 25/75 | ++ (590 nm) | 12 V |
| F6 (inv.) | G' | 50/50 | + (590 nm) | 10 V |
| F7 (inv.) | G' | 75/25 | + (590 nm) | 6 V |
| F8 (inv.) | G' | 90/10 | + (590 nm) | 4 V |
| F9 (inv.) | G' | 100/0 | — | — |

What is claimed is:

1. A method for manufacturing a Thin Film Inorganic Light Emitting Diode device, said method comprising following steps:
   either,
   (1) preparing a nanoparticle dispersion comprising together ZnS doped with a luminescent center (n-type semiconductor) and $Cu_xS$ (p-type semiconductor) by precipitation from appropriate aqueous solutions of the respective ions,
   (1') preparing a first separate nanoparticle dispersion of ZnS doped with a luminescent center (n-type semiconductor) and a second separate nanoparticle dispersion of $Cu_xS$ (p-type semiconductor), both by precipitation from appropriate aqueous solutions of the respective ions,
   (2) washing the dispersion prepared according to (1) or both dispersions prepared according to (1') to remove non-precipitated ions,
   (3) coating onto a first conductive electrode the dispersion resulting from steps (1) and (2), or a mixture of the dispersions resulting from steps (1') and (2) in one and the same layer, or the separate dispersions resulting from steps (1') and (2) in two separate layers,
   (4) applying on top of said coated layer(s) resulting from step (3) a second conductive electrode, with the proviso that at least one of said first and second electrodes is transparent.

2. A method according to claim 1 wherein said luminescent center in doped ZnS is Cu.

3. A method according to claim 1 wherein said luminescent center in doped ZnS is Mn.

4. A method according to claim 1 wherein the washing of the dispersion(s) obtained by steps (1)or (1') is performed by diafiltration and/or ultrafiltration.

5. A method according to claim 4 wherein said diafiltration is performed in the presence of a compound preventing agglomeration of nanoparticles.

6. A method according to claim 5 wherein said compound preventing agglomeration of nanoparticles is a polyphosphate or polyphosphoric acid.

7. A method according to claim 5 wherein said compound preventing agglomeration of nanoparticles is thioglycerol.

8. A method according to claim 5 wherein said compound preventing agglomeration of nanoparticles is a hexametaphosphate.

9. A method according to claim 1 wherein said precipitation(s) according to steps (1) or (1') is (are) performed according to the double jet principle.

10. A method according to claim 1 wherein said first conductive electrode is an ITO electrode.

11. A method according to claim 1 wherein said second conductive electrode is an aluminum electrode applied by vacuum deposition.

12. A Thin Film Inorganic Light Emitting Diode device manufactured according to the method of any of the previous claims.

* * * * *